(12) United States Patent
Kim et al.

(10) Patent No.: US 10,333,033 B2
(45) Date of Patent: Jun. 25, 2019

(54) LIGHT EMITTING DEVICE AND LIGHT SOURCE MODULE HAVING THEREOF

(71) Applicant: LG INNOTEK CO., LTD., Seoul (KR)

(72) Inventors: Jae Jin Kim, Seoul (KR); Do Hwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/329,396

(22) PCT Filed: Jul. 17, 2015

(86) PCT No.: PCT/KR2015/007423
§ 371 (c)(1),
(2) Date: Jan. 26, 2017

(87) PCT Pub. No.: WO2016/017969
PCT Pub. Date: Feb. 4, 2016

(65) Prior Publication Data
US 2017/0229614 A1    Aug. 10, 2017

(30) Foreign Application Priority Data

Jul. 30, 2014  (KR) .................. 10-2014-0097088

(51) Int. Cl.
*H01L 33/48*    (2010.01)
*H01L 33/52*    (2010.01)
(Continued)

(52) U.S. Cl.
CPC .......... *H01L 33/486* (2013.01); *H01L 33/483* (2013.01); *H01L 33/52* (2013.01); *H01L 33/56* (2013.01); *H01L 33/62* (2013.01)

(58) Field of Classification Search
CPC ........ H01L 33/486; H01L 33/62; H01L 33/56
See application file for complete search history.

(56) References Cited

U.S. PATENT DOCUMENTS

| 8,207,659 B2 | 6/2012 | Sato et al. |
| 8,415,693 B2 | 4/2013 | Inobe et al. |

(Continued)

FOREIGN PATENT DOCUMENTS

| CN | 101147270 | 3/2008 |
| CN | 101193983 | 6/2008 |
| CN | 201259098 | 6/2009 |
| CN | 102420283 | 4/2012 |
| CN | 20251123 U | 10/2012 |

(Continued)

OTHER PUBLICATIONS

International Search Report dated Nov. 18, 2015 issued in Application No. PCT/KR2015/007423.

(Continued)

*Primary Examiner* — Stephen M Bradley
*Assistant Examiner* — Wasiul Haider
(74) *Attorney, Agent, or Firm* — KED & Associates LLP

(57) ABSTRACT

A light emitting device according to an embodiment includes a body having a recess; a light emitting chip disposed in the recess; and a first dampproof layer sealing the light emitting chip and extended from a surface of the light emitting chip to a bottom of the recess, wherein the light emitting chip includes a wavelength range of 100 nm to 280 nm, and the first dampproof layer includes a fluororesin-based material.

18 Claims, 9 Drawing Sheets

(51) Int. Cl.
*H01L 33/56* (2010.01)
*H01L 33/62* (2010.01)

(56) References Cited

U.S. PATENT DOCUMENTS

| | | | |
|---|---|---|---|
| 2004/0208210 A1* | 10/2004 | Inoguchi | H01L 25/0753 372/36 |
| 2009/0189514 A1 | 7/2009 | Hiramatsu et al. | |
| 2009/0296367 A1* | 12/2009 | Sekine | H01L 33/60 362/84 |
| 2010/0052504 A1 | 3/2010 | Sato et al. | |
| 2012/0074434 A1 | 3/2012 | Park et al. | |
| 2013/0234274 A1 | 9/2013 | Kam et al. | |
| 2014/0175970 A1* | 6/2014 | Juang | C09K 11/7728 313/503 |
| 2015/0001563 A1* | 1/2015 | Miki | H01L 33/54 257/98 |
| 2015/0014710 A1* | 1/2015 | Yagi | H01L 33/56 257/88 |

FOREIGN PATENT DOCUMENTS

| | | |
|---|---|---|
| CN | 102775549 | 11/2012 |
| CN | 20261123 | 12/2012 |
| CN | 103855274 | 6/2014 |
| JP | 2009-179662 | 8/2009 |
| JP | 2010-056398 | 3/2010 |
| JP | 2011-199219 | 10/2011 |
| JP | 2012-054607 | 3/2012 |
| KR | 10-0910634 | 8/2009 |
| KR | 2010-0063083 | 6/2010 |
| KR | 10-1015166 | 2/2011 |
| KR | 2013-0063421 | 6/2013 |
| WO | WO 2009/096082 | 8/2009 |

OTHER PUBLICATIONS

Chinese Office Action dated Apr. 3, 2018 issued in Application No. 201580041846.2 (with English Translation).
Chinese Office Action issued in Application 201580041846.2 dated Oct. 15, 2018.

* cited by examiner

【FIG. 1】
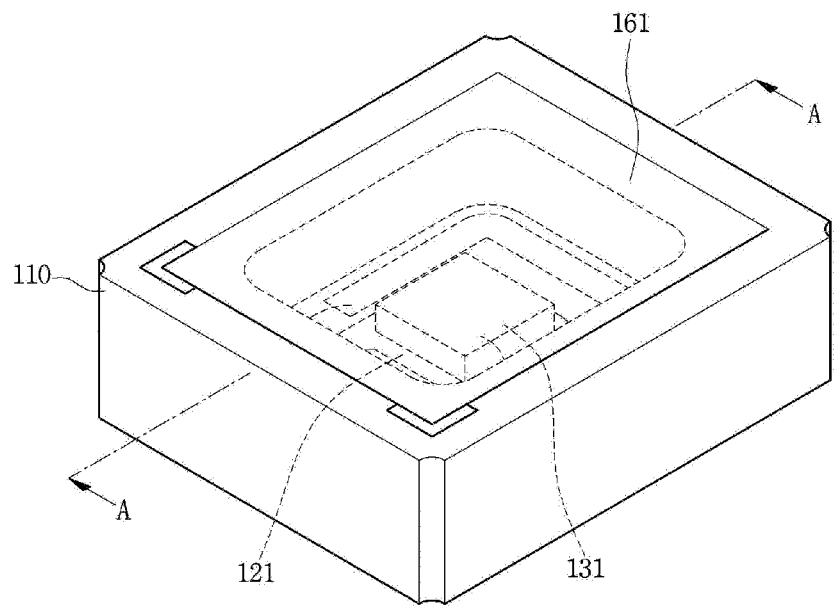
【FIG. 2】
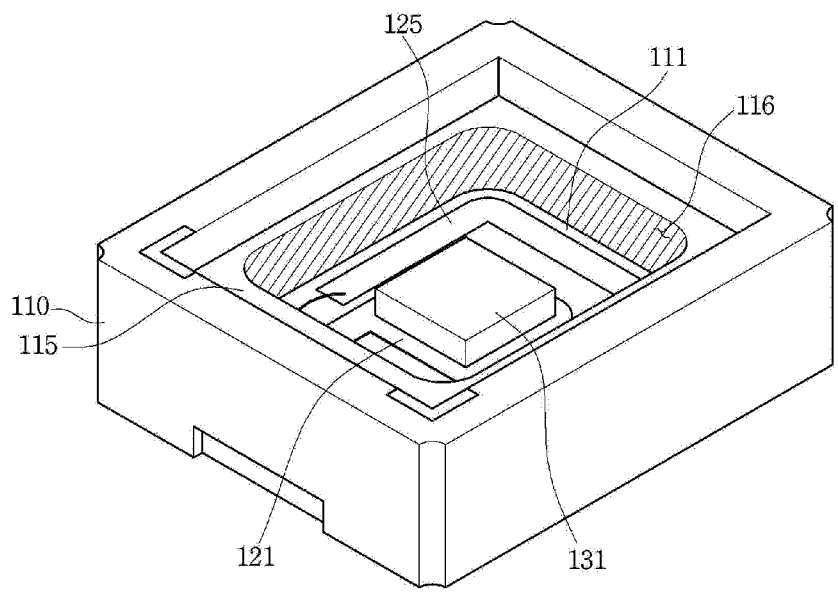

【FIG. 3】
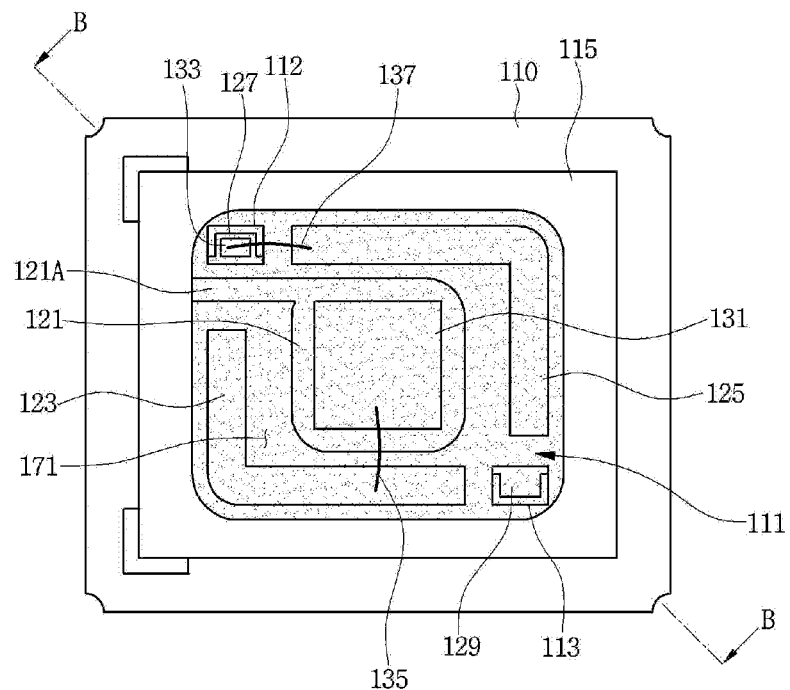
【FIG. 4】
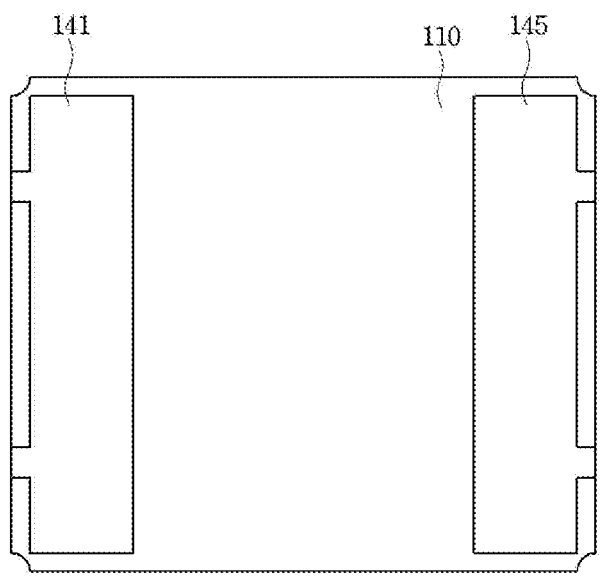

【FIG. 5】
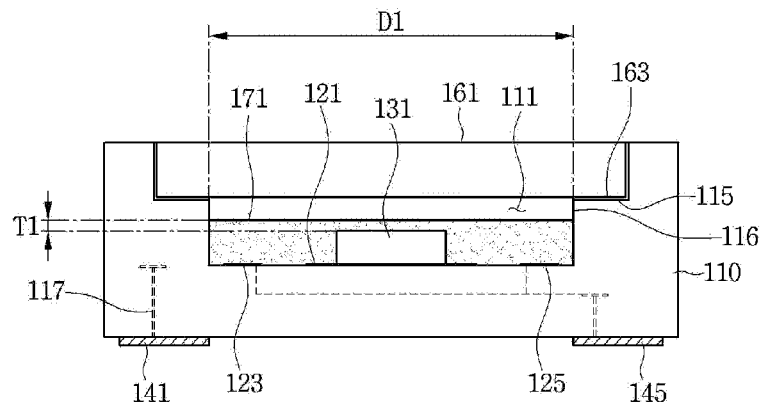
【FIG. 6】
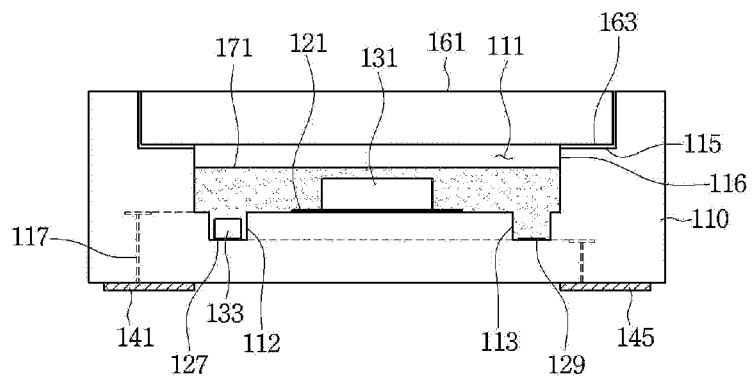
【FIG. 7】
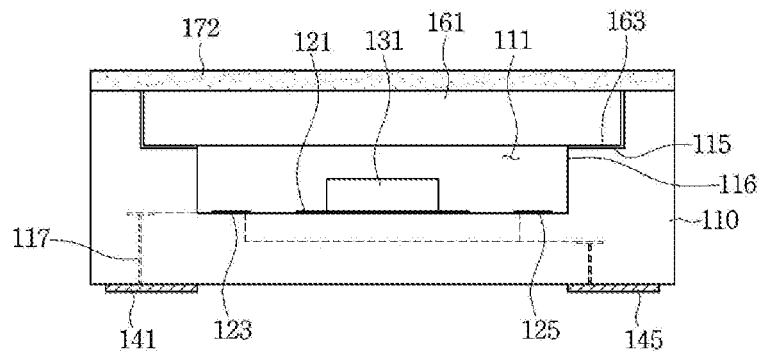

【FIG. 8】
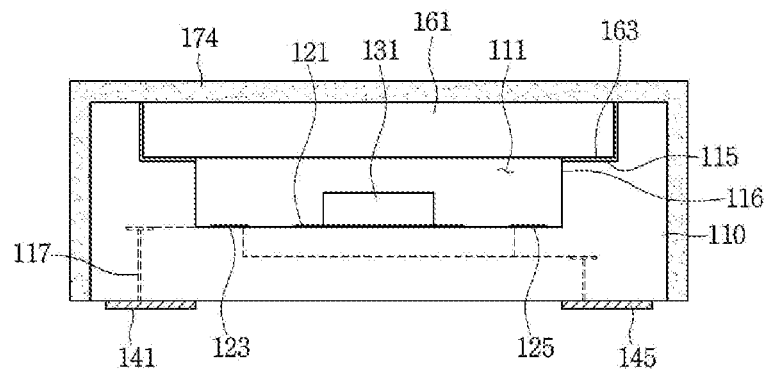
【FIG. 9】
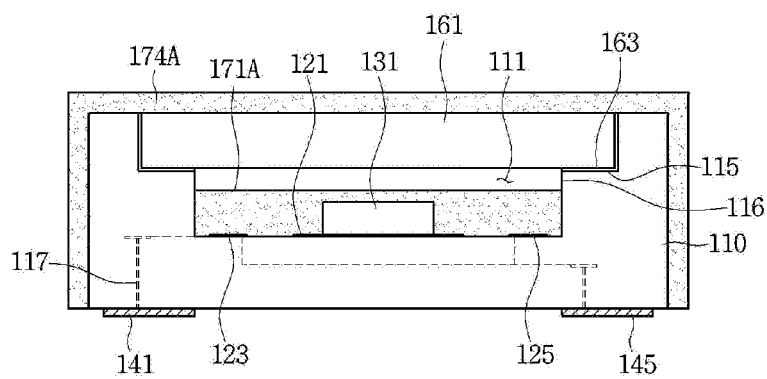
【FIG. 10】
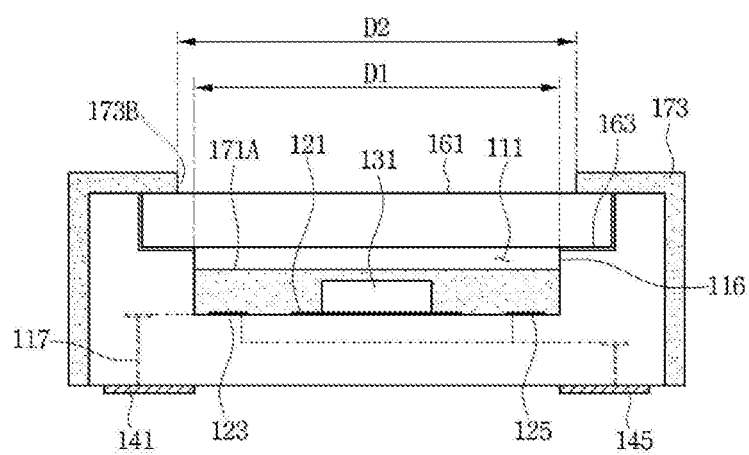

[FIG. 11]
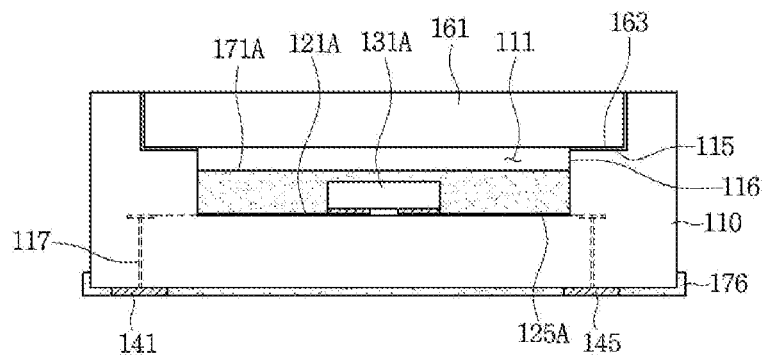
[FIG. 12]
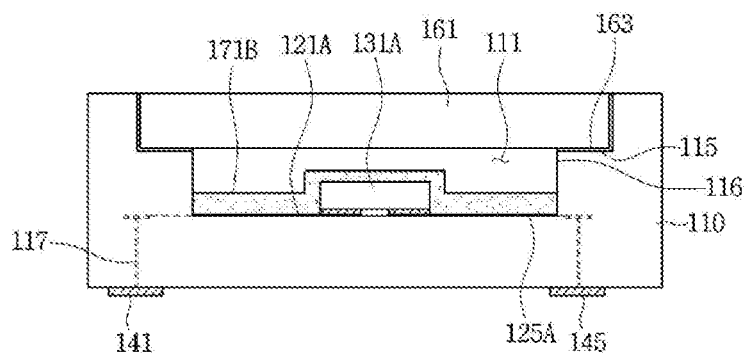
[FIG. 13]
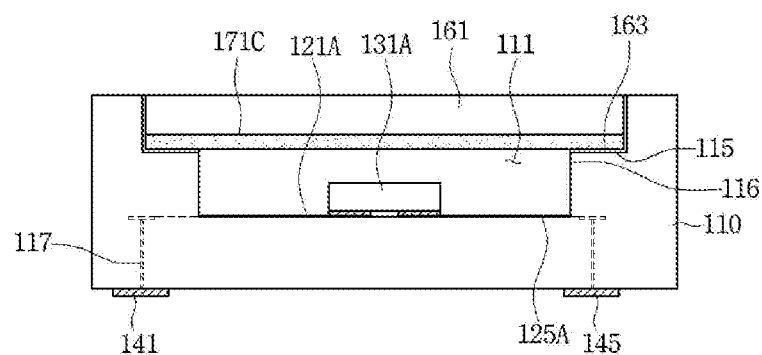

[FIG. 14]
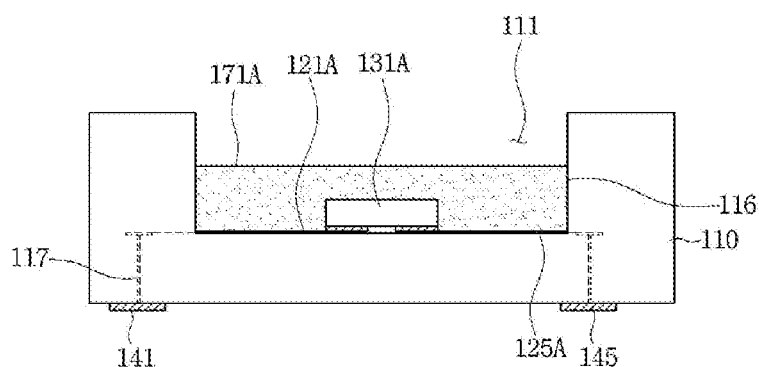
[FIG. 15]
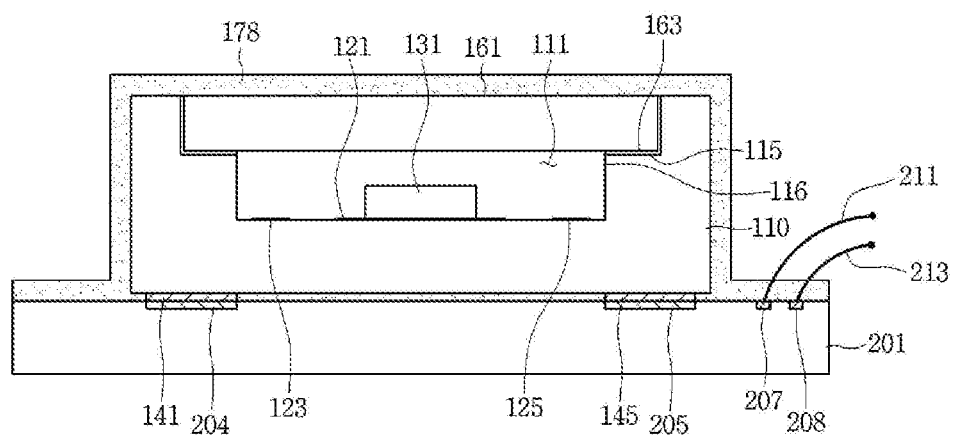

[FIG. 16]
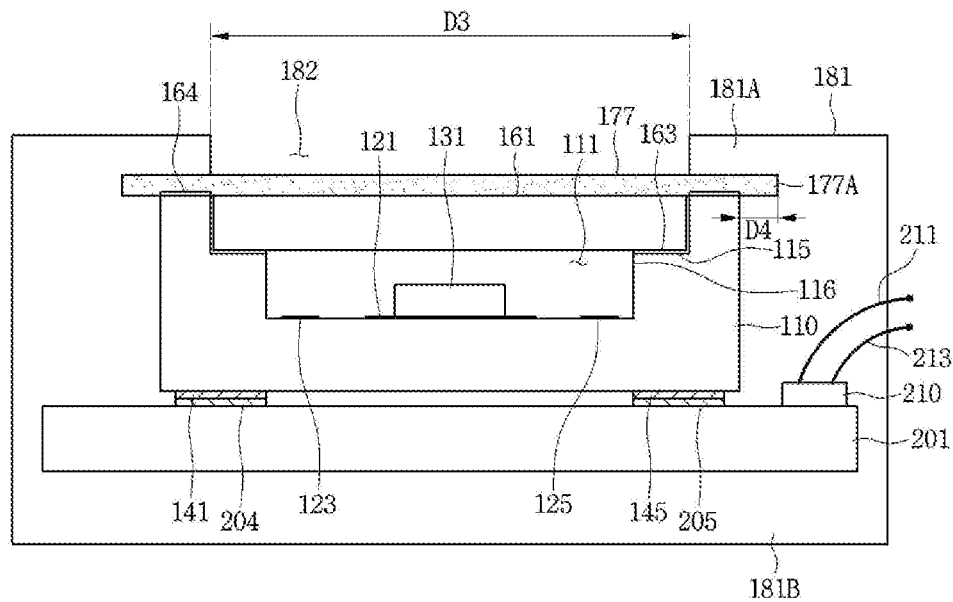
[FIG. 17]
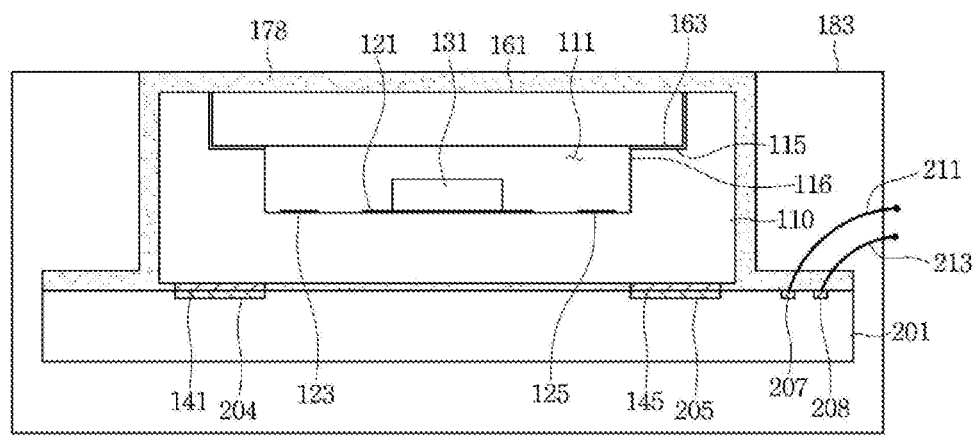

[FIG. 18]
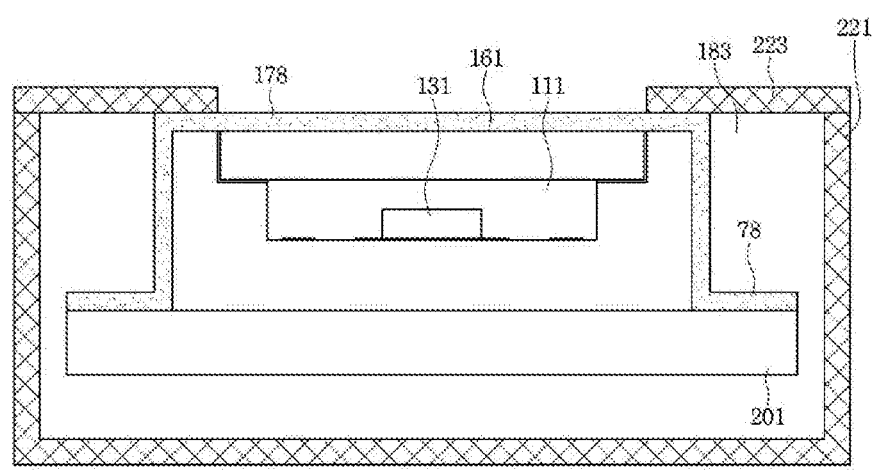
[FIG. 19]
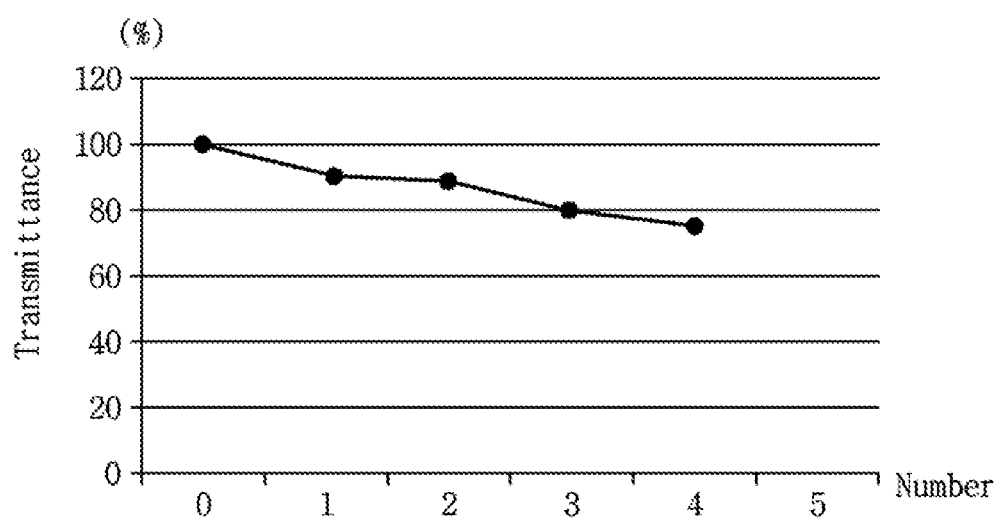

[FIG. 20]
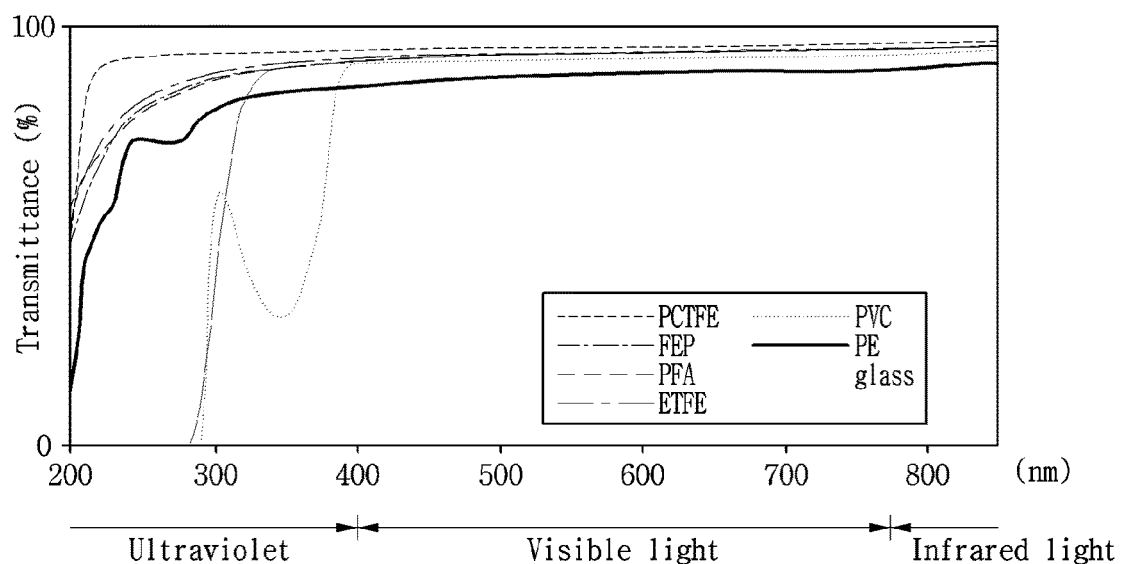
[FIG. 21]
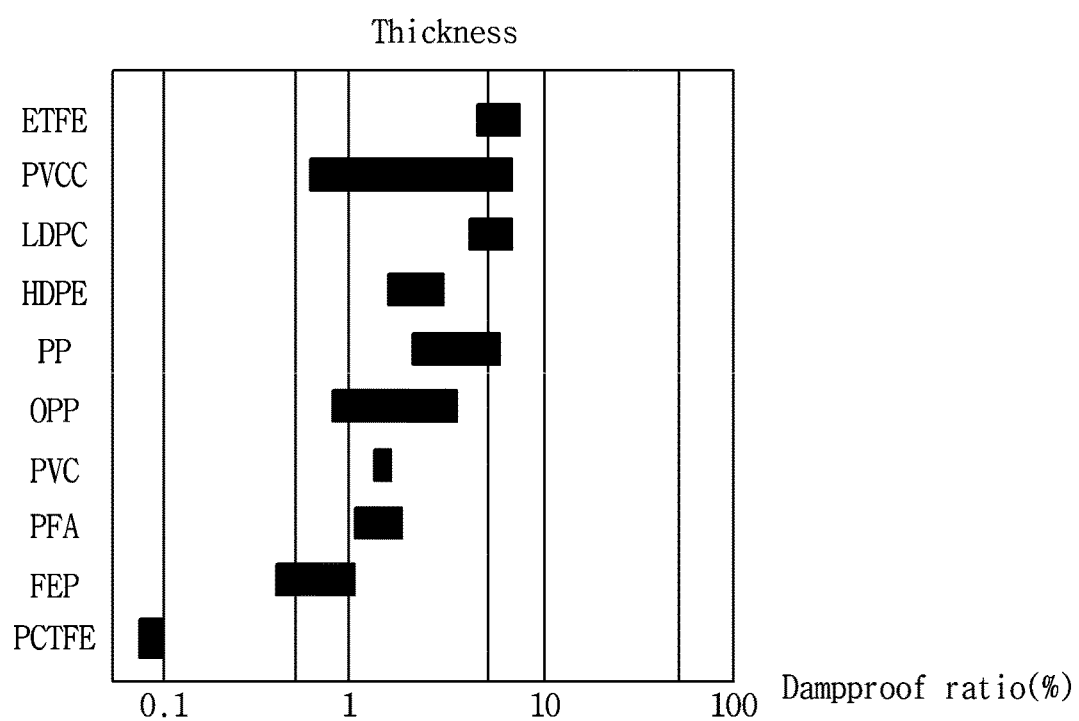

LIGHT EMITTING DEVICE AND LIGHT SOURCE MODULE HAVING THEREOF

CROSS-REFERENCE TO RELATED PATENT APPLICATIONS

This application is a U.S. National Stage Application under 35 U.S.C. § 371 of PCT Application No. PCT/KR2015/007423, filed Jul. 17, 2015, which claims priority to Korean Patent Application No. 10-2014-0097088, filed Jul. 30, 2014, whose entire disclosures are hereby incorporated by reference.

TECHNICAL FIELD

The present invention relates to a light emitting device and a light source module including the same.

BACKGROUND ART

A light emitting diode may configure a light emitting source by using compound semiconductor materials such as GaAs-based, AlGaAs-based, GaN-based, InGaN-based and InGaAlP-based materials.

Such a light emitting diode is packaged and used as a light emitting device emitting various colors, and the light emitting device is used as a light source in various fields such as a lighting indicator displaying a color, a character indicator, and an image indicator.

In particular, in the case of an ultraviolet light emitting diode (UV LED), it is used for sterilization and purification in the case of a short wavelength, and it may be used in an exposure apparatus or a curing apparatus in the case of a long wavelength. However, the environment in which the UV LED of a short wavelength is applied is mostly highly humid or inside water, so that dampproof and waterproof functions are deteriorated, and thus device failure is caused and operation reliability may be deteriorated.

DISCLOSURE

Technical Problem

The embodiment provides a light emitting device having a new waterproof and dampproof structure.

The embodiment provides a light emitting device having a dampproof layer covering a surface of a light emitting chip.

The embodiment provides a light emitting device having a dampproof layer covering a surface of a body in which a light emitting chip is disposed.

The embodiment provides a light emitting device including a dampproof layer extended from a light transmitting layer disposed on a light emitting chip to a surface of a body.

The embodiment provides a light emitting device having a plurality of dampproof layers covering a surface of body and a surface of a light emitting chip.

The embodiment provides a light emitting device having a body and a dampproof layer covering a surface of a substrate.

The embodiment provides a light emitting device having a dampproof layer including an ultraviolet light emitting chip and fluorine and a light source module.

The embodiment provides a light emitting device having a dampproof layer protecting an ultraviolet light emitting chip and a protection device from water or moisture and a light source module.

The embodiment may improve the reliability of an ultraviolet light source module.

Technical Solution

According to an embodiment, there is provided a light emitting device including a body having a recess; a light emitting chip disposed in the recess; and a first dampproof layer sealing the light emitting chip and extended from a surface of the light emitting chip to a bottom of the recess, and the light emitting chip includes a wavelength range of 100 nm to 280 nm, and the first dampproof layer includes a fluororesin-based material.

According to an embodiment, there is provided a light emitting device including a body having a recess; a light emitting chip disposed in the recess; a light transmitting layer disposed on the recess, and a first dampproof layer extended from an upper surface of the light transmitting layer to an upper surface of the body, and the light emitting chip includes a wavelength range of 100 nm to 280 nm, and the first dampproof layer includes a fluororesin-based material.

According to an embodiment, there is provided a light source module including a light emitting device having a first dampproof layer on a surface of a body; and a circuit board disposed below the body of the light emitting device, and the first dampproof layer of the light emitting device is extended to a side surface of the body and an upper surface of the circuit board.

Advantageous Effects

The embodiment may be provided as a waterproof module within a product applied to high humidity and underwater environments.

The embodiment may be provided as a sterilizing device in a high humidity environment and underwater.

The embodiment may reduce transmission loss of a UV-C wavelength.

The embodiment may minimize discoloration and deterioration by UV-C.

DESCRIPTION OF DRAWINGS

FIG. 1 is a perspective view of a light emitting device according to a first embodiment;

FIG. 2 is a perspective view in which a light transmitting layer is removed in the FIG. 1;

FIG. 3 is a floor plan view of the light emitting device of the FIG. 1 in which the light transmitting layer is removed;

FIG. 4 is a rear view of the light emitting device of the FIG. 1;

FIG. 5 is an A-A side cross-sectional view of the light emitting device of the FIG. 1;

FIG. 6 is a B-B side cross-sectional view of the light emitting device of the FIG. 3;

FIG. 7 is a side cross-sectional view of a light emitting device according to a second embodiment;

FIG. 8 is a side cross-sectional view of a light emitting device according to a third embodiment;

FIG. 9 is a side cross-sectional view of a light emitting device according to a fourth embodiment;

FIG. 10 is a side cross-sectional view of a light emitting device according to a fifth embodiment;

FIG. 11 is a side cross-sectional view of a light emitting device according to a sixth embodiment;

FIG. 12 is a side cross-sectional view of a light emitting device according to a seventh embodiment;

FIG. 13 is a side cross-sectional view of a light emitting device according to an eighth embodiment;

FIG. 14 is a side cross-sectional view of a light emitting device according to a ninth embodiment;

FIG. 15 is a side cross-sectional view of a light source module according to a tenth embodiment;

FIG. 16 is a side cross-sectional view of a light source module according to an eleventh embodiment;

FIG. 17 is a side cross-sectional view of a light source module according to a twelfth embodiment;

FIG. 18 is a side cross-sectional view of a light source module according to a thirteenth embodiment;

FIG. 19 is a graph comparing transmittances according to a number of times of dipping of a dampproof layer according to an embodiment;

FIG. 20 is a graph comparing transmittances according to materials of the dampproof layer according to the embodiment; and FIG. 21 is a graph illustrating a dampproof ratio depending on the material of the dampproof layer according to the embodiment.

MODES OF THE INVENTION

Hereinafter, an embodiment of the present invention will be described in detail with reference to the accompanying drawing so that a person skilled in the art to which the present invention belongs can easily carry out. However, the present invention may be embodied in many different forms and not limited to the embodiments described herein.

Throughout the specification, when a part is referred to as "including" an element, it means that the part may include other elements as well without excluding the other elements unless specifically stated otherwise. In order to clearly illustrate the present invention in the drawing, parts which are not related to the description are omitted, and in respect to similar parts throughout the specification, similar reference numbers are added.

In the description of an embodiment, when a part such as a layer, a film, an area, and a plate are "above" another part, not only a case in which the part is "directly above" another part but also a case in which there is another part therebetween are included. Conversely, when a part is "directly above" another part, it means that there is no other part therebetween.

Hereinafter, a light emitting device according to a first embodiment of the present invention will be described with reference to FIGS. 1 to 6.

FIG. 1 is a perspective view of a light emitting device according to a first embodiment, FIG. 2 is a perspective view in which a light transmitting layer is removed in the FIG. 1, FIG. 3 is a floor plan view of the light emitting device of the FIG. 1 in which the light transmitting layer is removed, FIG. 4 is a rear view of the light emitting device of the FIG. 1, FIG. 5 is an A-A side cross-sectional view of the light emitting device of the FIG. 1 and FIG. 6 is a B-B side cross-sectional view of the light emitting device of the FIG. 3.

Referring to FIGS. 1 to 6, a light emitting device 100 includes a body 110 having a recess 111, a plurality of electrodes 121, 123 and 125 disposed in the recess 111, a light emitting chip 131 disposed on at least one of the plurality of electrodes 121, 123 and 125, a light transmitting layer 161 disposed on the recess 111, and a fluororesin-based dampproof layer 171 covering a surface of the light emitting chip 131. The light emitting chip 131 may emit a UV-C wavelength, which is an ultraviolet wavelength ranging from 100 nm to 280 nm. The wavelength of the light emitting chip 131 is not limited thereto, and the light emitting chip 131 may emit at least one wavelength of visible light or infrared light.

The body 110 includes an insulating material such as a ceramic material. The ceramic material includes a low temperature co-fired ceramic (LTCC) or a high temperature co-fired ceramic (HTCC) which is co-fired at the same time. The material of the body 110 may be AlN, and may be formed of a metal nitride having a thermal conductivity of 140 W/mK or more.

As shown in FIGS. 5 to 6, a connection pattern 117 may be disposed in the body 110, and the connection pattern 117 may provide an electrical connection path between the recess 111 and a lower surface of the body 110.

An upper periphery of the body 110 includes a stepped structure 115. The stepped structure 115 is disposed at an upper periphery of the recess 111 as an area which is lower than an upper surface of the body 110. The depth of the stepped structure 115 is a depth from the upper surface of the body 110 and it may be formed deeper than the thickness of the light transmitting layer 161, but it is not limited thereto.

The recess 111 is a region where a part of the upper portion of the body 110 is opened and it may be formed of a predetermined depth from the upper surface of the body 110. For example, the recess 111 may be formed in a lower depth than the stepped structure 115 of the body 110. Here, a direction in which the recess 111 is formed may be a direction in which light generated from the light emitting chip 131 is emitted.

The recess 111 may have a polygonal shape, a circle shape or an elliptical shape. The recess 111 may have a chamfered shape, for example, a curved shape. Here, the recess 111 may be located further inside than the stepped structure 115 of the body 110.

A width of a lower portion of the recess 111 may be the same as a width of an upper portion of the recess 111 or the width of the upper portion may be formed larger. Also, a side wall 116 of the recess 111 may be formed to be vertical or inclined with respect to an extension line of a bottom surface of the recess 111.

As shown in FIGS. 2 to 3, a plurality of sub recesses 112 and 113 may be disposed in the recess 111. A bottom surface of each of the sub recesses 112 and 113 may be disposed at a lower depth than the bottom surface of the recess 111. A space between the plurality of sub recesses 112 and 113 may be greater than the width of the light emitting chip 131. A protection device 133 may be disposed on at least one of the plurality of sub recesses 112 and 113. The depth of each of the sub recesses 112 and 113 may be equal to or deeper than the thickness of the protection device 133. The depth of each of the sub recesses 112 and 113 may be formed in a depth such that an upper surface of the protection device 133 does not protruded above the bottom surface of the recess 111. As the protection device 133 is disposed on at least one of the sub recesses 112 and 113, the protection device 133 does not protrude above the bottom surface of the recess 111 and absorption of light emitted from the light emitting chip 131 may be reduced, deterioration of the light extraction efficiency may be prevented, and it is possible to prevent the directivity angle of the light from being distorted.

The plurality of sub recesses 112 and 113 are disposed on opposite sides based on the light emitting chip 131. Accordingly, heat generated from the light emitting chip 131 may be uniformly distributed in the recess 111, and thus the heat resistance of the light emitting device may be improved. As another example, the protection device 133 may be disposed in a first sub recess 112 of the plurality of sub recesses 112 and 113, and the other second sub recess 113 may be used as a dummy. The protection device 133 includes a Zener diode. The protection device 133 is connected in parallel to the light emitting chip 131 and electrically protects the light emitting chip 131. The first and second sub recesses 112 and 113 may not be formed, and in this case, the protection device 133 may be removed or disposed at the bottom of the recess 111.

Electrodes 121, 123, 125, 127 and 129 are disposed in the recess 111 and the sub recesses 112 and 113, and the electrodes 121, 123, 125, 127 and 129 selectively supply power to the light emitting chip 131 and the protection device 133. The electrodes 121, 123, 125, 127 and 129 may optionally include a metal such as platinum (Pt), titanium (Ti), copper (Cu), nickel (Ni), gold (Au), tantalum (Ta) and aluminum (Al). At least one of the electrodes 121, 123, 125, 127 and 129 may be formed as a single layer or multiple layers. Here, in an electrode of multiple layers, a gold (Au) material having good bonding may be disposed on a top layer, and a material of titanium (Ti), chromium (Cr) or tantalum (Ta) having good adhesion to the body 110 may be disposed on a lowest layer, and platinum (Pt), nickel (Ni), copper (Cu) or the like may be disposed on a middle layer between the top layer and the lowest layer. The present invention is not limited to the laminated structure of such electrodes.

Describing the electrodes 121, 123, 125, 127 and 129 specifically, a first electrode 121 on which the light emitting chip 131 is disposed, a second electrode 123 and a third electrode 125 spaced apart from the first electrode 121, and fourth and fifth electrodes 127 and 129 respectively disposed in the sub recesses 112 and 113 are included. The first electrode 121 is disposed at a center of the bottom of the recess 111, and the second electrode 123 and the third electrode 125 may be disposed at both sides of the first electrode 121. Any one of the first electrode 121 and the second electrode 123 may be removed, but the present invention is not limited thereto. As another example, the light emitting chip 131 may be disposed on a plurality of electrodes of the first to third electrodes 121, 123 and 125, but the present invention is not limited thereto.

One of the fourth and fifth electrodes 127 and 129, for example, the fourth electrode 127 may be electrically connected to the protection device 133.

Power of a first polarity may be supplied to the second and third electrodes 123 and 125, and power of a second polarity may be supplied to the first, fourth and fifth electrodes 121, 127 and 129. Polarity of each of the electrodes 121, 123, 125, 127 and 129 may vary depending on an electrode pattern or connection method with each device, and is not limited thereto.

Here, in the case in which the first electrode 121 is not electrically connected to the light emitting chip 131, the first electrode 121 may be used as a non-polar metal layer or a heat dissipation plate. Each of the electrodes 121, 123, 125, 127 and 129 may be defined as a metal layer, but is not limited thereto.

A portion 121A of the first electrode 121 may extend into the body 110 and may be electrically connected to another electrode through the connection pattern 117. The first to fifth electrodes 121, 123, 125, 127 and 129 may be selectively connected to the connection pattern 117 inside the body 110. For example, the connection pattern 117 connects the first electrode 121, the fourth and fifth electrodes 127 and 129 and a first pad 141 each other, and it may connect the second and third electrodes 123 and 125 and a second pad 145 each other, but the present invention is not limited thereto.

As shown in FIGS. 4 to 6, a plurality of pads 141 and 145 are disposed on the lower surface of the body 110. The plurality of pads 141 and 145 includes a first pad 141 and a second pad 145, and the first and second pads 141 and 145 may be spaced apart from each other on the lower surface of the body 110. At least one of the first and second pads 141 and 145 may be disposed in a plural, and may disperse a current path, but is not limited thereto.

A radiation member (not shown) may be disposed in the body 110. The radiation member may be disposed below the light emitting chip 131, that is, below the first electrode 121, and it may dissipate heat generated from the light emitting chip 131. The material of the radiation member may be a metal, for example, an alloy.

A light emitting chip 131 may be disposed in the recess 111. The light emitting chip 131 is a UV LED, and may be an UV LED emitting a wavelength in the range of 100 nm to 280 nm. That is, the light emitting chip 131 may emit short wavelength ultraviolet of 280 nm or less. The ultraviolet wavelength has an effect of reducing various biological pollutants such as bacteria and viruses.

The light emitting chip 131 may be bonded to the first electrode 121 by a conductive adhesive and may be connected to the second electrode 123 by a first connection member 135. The light emitting chip 131 may be electrically connected to the first electrode 121, the second electrode 123 or the third electrode 125. The connection method of the light emitting chip 131 may be connected by selectively using wire bonding, die bonding, and flip bonding, and such a bonding method may be changed depending on a chip type and an electrode position of the chip. The protection device 133 may be bonded to the fourth electrode 127 and may be connected to the third electrode 125 by a second connection member 137, and it may be electrically connected to the third electrode 125 and the fourth electrode 127. The first and second connection members 135 and 137 include wire for example.

The light emitting chip 131 may be formed of a compound semiconductor of group II and VI elements, or a compound semiconductor of group III and V elements. The light emitting chip 131 may selectively include a semiconductor light emitting device manufactured by using a compound semiconductor such as AlInGaN, InGaN, AlGaN, GaN, GaAs, InGaP, AlInGaP, InP, and InGaAs. The light emitting chip 131 may include an n-type semiconductor layer, a p-type semiconductor layer, and an active layer. The active layer may be implemented as a pair such as InGaN/GaN, InGaN/AlGaN, InGaN/InGaN, GaN/AlGaN, InAlGaN/InAlGaN, AlGaAs/GaAs, InGaAs/GaAs, InGaP/GaP, AlInGaP/InGaP, and InP/GaAs.

The dampproof layer 171 is formed on the recess 111, and may have a thickness covering an upper surface of the light emitting chip 131. For example, the dampproof layer 171 is formed to be thicker than the light emitting chip 131 to protect the light emitting chip 131 from water or moisture.

The dampproof layer 171 may include fluorine. The fluorine has a strong chemical bonding force with carbon and does not cause molecular bond breakage due to ultraviolet. The dampproof layer 171 may be defined as a fluororesin-based layer, and a molecular chain of the dampproof layer 171 is a helical structure, and the molecular chain structure has a three-dimensional spiral structure, so that fluorine atoms seal around a carbon-carbon bond. The dampproof layer 171 protects the destruction of molecular chains due to penetration of ultraviolet or oxygen. Also, the dampproof layer 171 may protect the device by blocking oxygen or moisture such as water or oil from penetrating to the surface of the device as much as possible. The dampproof layer 171 transmits light emitted from the light emitting chip 131 as a translucent material.

Also, the dampproof layer 171 may be used with at least one of PCTFE (Polychlorotrifluoroethylene), ETFE (Ethylene+Tetrafluoroethylene), FEP (Fluorinated ethylene propylene copolymer), and PFA (Perfluoroalkoxy). In the graph of the transmittance of FIG. 19, the transmittance is high in the order of PCTFE, ETFE, FEP, and PFA in an ultraviolet range, and in the moisture absorption ratio at an ultraviolet wavelength according to the dampproof material of FIGS. 20 and 21, PCTFE, FEP, and PFA are shown in that order. Therefore, at least one of PCTFE, FEP, and PFA may be used as a dampproof layer.

The dampproof layer 171 is attached to the surface of the light emitting chip 131 and may be extended to the bottom surface of the recess 111. The dampproof layer 171 may be extended from the bottom of the recess 111 to the side wall 116. The dampproof layer 171 is sealed to top and side surfaces of the light emitting chip 131 and the bottom surface and the side wall 116 of the recess 111 to protect the light emitting chip 131 from water or moisture.

The dampproof layer 171 prevents water from penetrating into the interface between the light emitting chip 131 and the bottom surface of the recess 111.

Also, the dampproof layer 171 seals the plurality of electrodes 121, 123, 125, 127 and the protection device 133. This dampproof layer 171 may prevent water from penetrating into the protection device 133. Since the dampproof layer 171 is effective for dampproofing in the recess 111, so a water resistant light emitting device may be provided.

By using the dampproof layer 171 with a fluororesin material, there is no damage such as bond breaking between molecules due to the ultraviolet wavelength emitted from the light emitting chip 131, and a decrease in light extraction efficiency may be minimized.

Referring to FIG. 5, a thickness of the dampproof layer 171 may be equal to or less than 1 mm, and the thickness may cover at least the light emitting chip 131, and when it is more than 1 mm, the transmittance of ultraviolet may be reduced. A thickness T1 from the upper surface of the light emitting chip 131 may be formed, for example, in the range of 0.5 µm to 10 µm. When the thickness T1 of the dampproof layer 171 exceeds the above range, the light transmittance is remarkably decreased, and when it is less than the above range, the humidity resistance is reduced.

The dampproof layer 171 according to the embodiment may have a transmittance of 70% to 95% with respect to the wavelength emitted from the light emitting chip 131. When the transmittance is less than 70%, the optical reliability may be deteriorated due to a decrease in function. The dampproof layer 171 may transmit the light without damaging the light emitted from the light emitting chip 131.

In one example of a coating method of the dampproof layer 171, a fluororesin-based dampproof layer of liquid melting fluorine in a resin solvent is coated. Table 1 is a table for measuring the transmittance according to a fluorine content. The content of fluorine dissolved in the resin solvent was tested after being dissolved and coated in the range of 1 to 3 wt %. As follows, when the fluorine content is 1 wt %, the average transmittance after curing is 94.5%, and in the case of 2 wt %, the average transmittance after curing is 90.4%, and in the case of 3 wt %, the average transmittance after curing is 82.9%.

TABLE 1

| Sample number | Fluorine content (wt %) | Transmittance (%) |
|---|---|---|
| #1 | 1 wt % | 94.3% |
| #2 |  | 94.0% |
| #3 |  | 95.2% |
| #4 | 2 wt % | 85.3% |
| #5 |  | 91.8% |
| #6 |  | 94.2% |
| #7 | 3 wt % | 81.5% |
| #8 |  | 83.6% |
| #9 |  | 95.2% |

It may be seen that the transmittance is decreased as the content of fluorine is increased. The fluorine content in the dampproof layer 171 according to the embodiment may be smaller after curing, but is not limited thereto.

Also, the transmittance may be changed according to the number of layers to be coated, that is, the number of times of dipping. For example, as the number of times of dipping increases, the transmittance may be reduced. When the transmittance is 100% in the case in which the dampproof layer 171 is not formed on the light emitting chip 131, the transmittance after dipping once is 90.60%, the transmittance after dipping twice is 89.22%, the transmittance after dipping three times is 79.97%, the transmittance after dipping four times is 75.86%, and the transmittance after dipping five times is 72.13%. Also, it may be seen that as the number of times of dipping increases, the thickness is increased and the transmittance is decreased. The embodiment may provide a structure in which the dampproof layer 171 has a thickness of 10 µm or less from the top surface of the light emitting chip 131 for the transmittance and moisture resistance.

As shown in FIGS. 1, 5 and 6, a light transmitting layer 161 is disposed on the recess 111. The light transmitting layer 161 includes a glass material such as quartz glass. Accordingly, the light transmitting layer 161 may be defined as a material capable of transmitting light emitted from the light emitting chip 131 without damaging such as bond breakage between molecules due to the ultraviolet wavelength.

An outer periphery of the light transmitting layer 161 is coupled to the stepped structure of the body 110. An adhesive layer 163 is disposed between the light transmitting layer 161 and the stepped structure 115 of the body 110, and the adhesive layer 163 includes a resin material such as silicone or epoxy. The light transmitting layer 161 may have a width wider than the width of the recess 111. A lower surface area of the light transmitting layer 161 may be larger than a bottom surface area of the recess 111. Accordingly, the light transmitting layer 161 may be easily coupled to the stepped structure 115 of the body 110.

The light transmitting layer 161 may be spaced apart from the light emitting chip 131. Since the light transmitting layer 161 is spaced apart from the light emitting chip 131, heat expansion caused by the light emitting chip 131 may be reduced. A region between the light transmitting layer 161 and the dampproof layer 171 may be an empty space or may be filled with a nonmetal or a metal chemical element, but the present invention is not limited thereto. A lens may be coupled onto the light transmitting layer 161 but the present invention is not limited thereto. Further, a molding member is further disposed on the side surface of the body 110, and may perform dampproofing and device protection.

FIG. 7 is a side cross-sectional view of a light emitting device according to a second embodiment.

Referring to FIG. 7, the light emitting device according to the embodiment includes a body 110 having a recess 111, a plurality of electrodes 121, 123, and 125 disposed in the recess 111, a light emitting chip 131 disposed on at least one of the plurality of electrodes 121, 123, 125, a light transmitting layer 161 disposed on the recess 111, and a fluororesin-based dampproof layer 172 disposed on the light transmitting layer 161 and an upper surface of the body 110.

The light emitting chip 131 may emit an ultraviolet wavelength, that is, a wavelength in the range of 100 nm to 280 nm. The light transmitting layer 161 may be formed of a transparent material, such as glass, which is free from damage due to the ultraviolet wavelength. The dampproof layer 172 is extended from an upper surface of the light transmitting layer 161 to the upper surface of the body 110. The dampproof layer 172 has a fluororesin-based material, and may transmit light without breaking bonds between molecules by the light emitted from the light emitting chip 131.

The dampproof layer 172 covers the upper surface of the body 110 and the upper surface of the light transmitting layer 161 to block water or moisture penetrating the upper surface of the body 110. The dampproof layer 172 may be in contact with an adhesive layer 163 bonded to the light transmitting layer 161 and a stepped structure 115 of the body 110.

The dampproof layer 172 may be formed to have a thickness ranging from 0.5 μm to 10 μm, and the thickness may vary depending on the number of dips of the dampproof layer 172, but it may be a thickness range that the transmittance is 70% or more. When the thickness of the dampproof layer 172 exceeds the above mentioned range, the light transmittance is remarkably decreased, and when the thickness is less than the above range, moisture resistance is deteriorated. The dampproof layer 172 may be extended from the upper surface of the body 110 to a side surface portion of the body 110, but the present invention is not limited thereto. By further extending the dampproof layer 172 to a part of the side surface of the body 110, a water- or moisture-blocking effect may be further increased.

A lens may be coupled onto the dampproof layer 172, but the present invention is not limited thereto. Further, a molding member may be further disposed on the side surface of the body 110 to perform dampproofing and device protection.

FIG. 8 is a side cross-sectional view of a light emitting device according to a third embodiment.

Referring to FIG. 8, the light emitting device according to the embodiment includes a body 110 having a recess 111, a plurality of electrodes 121, 123, and 125 disposed in the recess 111, a light emitting chip 131 disposed on at least one of the plurality of electrodes 121, 123 and 125, a light transmitting layer 161 disposed on the recess 111, and a fluororesin-based dampproof layer 174 disposed on an upper surface of the light transmitting layer 161 and upper and side surfaces of the body 110.

The light emitting chip 131 may emit an ultraviolet wavelength, that is, a wavelength in the range of 100 nm to 280 nm. The light transmitting layer 161 may be formed of a glass material having no damage, such as bonding failure between molecules due to the ultraviolet wavelength. The dampproof layer 174 is extended from the upper surface of the light transmitting layer 161 to the upper surface of the body 110. The dampproof layer 174 has a fluororesin-based material and may transmit light without being broken by the light emitted from the light emitting chip 131.

The dampproof layer 174 may be extended from the upper surface of the light transmitting layer 161 to the upper surface and the side surface of the body 110 for dampproofing. The dampproof layer 174 is disposed on the entire upper surface area of the light transmitting layer 161, the entire upper surface area of the body 110, and the entire side surface area of the body 110, and water or moisture may be prevented from permeating through the body 110 and other components. A thickness of the dampproof layer 174 may be in the range of 0.5 μm to 10 μm, when the thickness of the dampproof layer 174 exceeds the above mentioned range, the light transmittance is remarkably decreased, and when the thickness is less than the above range, moisture resistance is deteriorated. The dampproof layer 174 may be extended on a lower surface of the body 110, and in this case, it may be formed on an area except the first and second pads 141 and 145. Accordingly, water or moisture penetrating into the lower surface of the body 110 may be blocked.

A lens may be coupled onto the dampproof layer 174, but the present invention is not limited thereto. Further, a molding member may be further disposed on an outer side part of the dampproof layer 174, and it may perform dampproofing and device protection.

FIG. 9 is a side cross-sectional view of a light emitting device according to a fourth embodiment.

Referring to FIG. 9, the light emitting device according to the embodiment includes a body 110 having a recess 111, a plurality of electrodes 121, 123, and 125 disposed in the recess 111, a light emitting chip 131 disposed on at least one of the plurality of electrodes 121, 123 and 125, a first dampproof layer 171A sealing the light emitting chip 131 on the recess 111, a light transmitting layer 161 disposed on the recess 111, and a second dampproof layer 174A disposed on an upper surface of the light transmitting layer 161 and upper and side surfaces of the body 110.

The light emitting chip 131 may emit an ultraviolet wavelength, that is, a wavelength in the range of 100 nm to 280 nm. The light transmitting layer 161 may be formed of a glass material having no damage due to the ultraviolet wavelength. The first and second dampproof layers 171A and 174A have fluororesin-based materials and may transmit light without being broken by the light emitted from the light emitting chip 131.

The first dampproof layer 171A may be adhered and extended to a bottom of the recess 111 from a surface of the light emitting chip 131 in the recess 111. The first dampproof layer 171A blocks water or moisture penetrating into the light emitting chip 131 in the recess 111. The first dampproof layer 171A may be extended and contacted to a side wall of the recess 111, but is not limited thereto. The distance between an upper surface of the first dampproof layer 171A and an upper surface of the light emitting chip 131 may be equal to or less than 10 μm and the distance between the bottom of the recess 111 and the upper surface of the first dampproof layer 171A may be equal to or less than 1 mm. When the first dampproof layer 171A exceeds 10 μm from the upper surface of the light emitting chip 131, light transmittance or moisture barrier rate may be significantly lowered, and when the distance between the bottom of the recess 111 and the upper surface of the first dampproof layer 171A is more than 1 mm, the light transmittance may be remarkably lowered.

The second dampproof layer 174A may be extended from the upper surface of the light transmitting layer 161 to the upper surface of the body 110 or may be extended from the upper surface of the light transmitting layer 161 to the upper surface and the side surface of the body 110. Also, the second dampproof layer 174A may be extended to a lower surface of the body 110 and may block water or moisture penetrating through the lower surface of the body 110. The second dampproof layer 174A may prevent water or moisture from penetrating through the surface of the body 110. The second dampproof layer 174A may have a thickness of 10 μm or less, and when the thickness is more than 10 μm, the light transmittance and the moisture barrier rate may be decreased.

The material of the first and second dampproof layers 171A and 174A may be used with at least one of PCTFE (Polychlorotrifluoroethylene), ETFE (Ethylene+Tetrafluoroethylene), FEP (Fluorinated ethylene propylene copolymer) and PFA (Perfluoroalkoxy). The first and second dampproof layers 171A and 174A may include the same material or different materials. For example, the first and second dampproof layers 171A and 174A may be formed of PCTFE, or the first dampproof layers 171A may be formed of PCTFE and the second dampproof layer 174A may be formed of ETFE, different from the material of the first dampproof layer. Alternatively, the first dampproof layer 171A may be formed of a material having a higher water or moisture blocking rate (hereinafter, abbreviated as dampproof ratio) than the second dampproof layer 174A and may protect the light emitting chip 131. On the contrary, the second dampproof layer 174A is formed of a material having a higher dampproof ratio than the first dampproof layer 171A, so that the dampproof ratio may be increased primarily on the surface of the light emitting device. The first dampproof layer 171A may be formed of a material having a higher transmittance than the second dampproof layer 174A, and a decrease in transmittance may be reduced. The embodiment may be effective for dampproofing by performing double dampproofing through the first and second dampproof layers 171A and 174A.

A lens may be coupled onto the second dampproof layer 174A, but the present invention is not limited thereto. Further, a molding member may be further disposed on an outer side part of the second dampproof layer 174A, and may perform dampproofing proof and device protection.

FIG. 10 is a side cross-sectional view of a light emitting device according to a fifth embodiment.

Referring to FIG. 10, the light emitting device according to the embodiment includes a body 110 having a recess 111, a plurality of electrodes 121, 123, and 125 disposed in the recess 111, a light emitting chip 131 disposed on at least one of the plurality of electrodes 121, 123 and 125, a first dampproof layer 171A sealing the light emitting chip 131 on the recess 111, a light transmitting layer 161 disposed on the recess 111, a second dampproof layer 173 disposed on an upper surface outer periphery of the light transmitting layer 161 and upper and side surfaces of the body 110.

The light emitting chip 131 may emit an ultraviolet wavelength, that is, a wavelength in the range of 100 nm to 280 nm. The light transmitting layer 161 may be formed of a glass material having no damage due to the ultraviolet wavelength. The first and second dampproof layers 171A and 173 have fluororesin-based materials and may transmit light without being broken by the light emitted from the light emitting chip 131.

The first dampproof layer 171A may be extended to a bottom of the recess 111 from a surface of the light emitting chip 131 in the recess 111. The first dampproof layer 171A blocks water or moisture penetrating into the light emitting chip 131 in the recess 111. The first dampproof layer 171A may be contacted to a side wall of the recess 111, but is not limited thereto. The distance between an upper surface of the first dampproof layer 171A and an upper surface of the light emitting chip 131 may be equal to or less than 10 μm, and when the distance exceeds 10 μm, light transmittance and moisture barrier rate may be lowered. The second dampproof layer 173 may be extended from the outer periphery of the upper surface of the light transmitting layer 161 to the upper surface of the body 110 or may be extended from the outer periphery of the upper surface of the light transmitting layer 161 to the upper surface and the side surface of outer side of the body 110, and it may block water or moisture. Also, the second dampproof layer 173 may be extended to a lower surface of the body 110 and may block water or moisture penetrating through the lower surface of the body 110.

The second dampproof layer 173 has an open region 173B and the upper surface of the light transmitting layer 161 may be exposed through the open region 173B. The second dampproof layer 173 may be disposed so as not to overlap a bottom region of the recess 111 in a vertical direction. A width D2 of the open region 173B of the second dampproof layer 173 may be wider than or equal to a bottom width D1 of the recess 111. By disposing the open area 173B in the second dampproof layer 173, the interference with the light emitted from the light emitting chip 131 is minimized and the light extraction efficiency may be improved.

The second dampproof layer 173 may prevent water or moisture from penetrating through the surface of the body 110. A thickness of the second dampproof layer 173 may be about 0.5 μm to 10 μm. When the thickness of the second dampproof layer 173 exceeds the above range, the light transmittance is remarkably decreased, and when the thickness is less than the above range, moisture resistance may be deteriorated.

A lens may be coupled onto the second dampproof layer 173, but the present invention is not limited thereto.

The material of the first and second dampproof layers 171A and 173 may be used with at least one of PCTFE (Polychlorotrifluoroethylene), ETFE (Ethylene+Tetrafluoroethylene), FEP (Fluorinated ethylene propylene copolymer) and PFA (Perfluoroalkoxy). The first and second dampproof layers 171A and 173 may include the same material or different materials. For example, the first and second dampproof layers 171A and 173 may be formed of PCTFE, or the first dampproof layer 171A may be formed of PCTFE and the second dampproof layer 173 may be formed of ETFE different from the material of the first dampproof layer 171A.

In addition, the first dampproof layer 171A may be formed of a material having a higher dampproof ratio than the second dampproof layer 173 to protect the light emitting chip 131, or the second dampproof layer 173 is formed of a material having a higher dampproof ratio than the first dampproof layer 171A, and may increase the primary dampproof ratio on the surface of the light emitting device. The first dampproof layer 171A may be formed of a material having a higher transmittance than the second dampproof layer 173 among the materials, thereby reducing a decrease in transmittance. Further, a molding member is further disposed on an outer side part of the second dampproof layer 173, and may perform dampproofing and device protection.

FIG. 11 is a side cross-sectional view of a light emitting device according to a sixth embodiment.

Referring to FIG. 11, the light emitting device according to the embodiment includes a body 110 having a recess 111, a plurality of electrodes 121A and 125A disposed in the recess 111, a light emitting chip 131A disposed on at least one of the plurality of electrodes 121A and 125A, a first dampproof layer 171A covering a surface of the light emitting chip 131A and a light transmitting layer 161 disposed on the first dampproof layer 171A.

The light emitting chip 131A may emit an ultraviolet wavelength, that is, a wavelength in the range of 100 nm to 280 nm. The light emitting chip 131A is arranged on the plurality of electrodes 121A and 125A in a flip chip manner. Since the light emitting chip 131A is disposed in a flip chip manner, it is not necessary to dispose a separate connection member, so water or moisture through the connection member connected to the light emitting chip 131A may be blocked, and defect of the connection member may be prevented.

The light emitting chip 131A according to the embodiment may be disposed in the recess 111 in a flip chip manner and the first dampproof layer 171A may be disposed in the recess 111. As another example, the structure of the first dampproof layer 171A may selectively adopt the embodiments described above, but the present invention is not limited thereto.

Also, a second dampproof layer 176 may be disposed on a lower surface of the body 110. The second dampproof layer 176 may be disposed on the lower surface of the body 110 and may be in contact with the first and second pads 141 and 145 as a fluororesin-based dampproof layer. The second dampproof layer 176 is disposed on the lower surface of the body 110 and may block the penetration of water or moisture through the first and second pads 141 and 145. The second dampproof layer 176 may be extended from the lower surface of the body 110 to a side surface portion, and it may prevent penetration of water or moisture. Further, a molding member is further disposed on an outer side part of the body 110 and may perform moisture proof and device protection.

FIG. 12 is a side cross-sectional view of a light emitting device according to a seventh embodiment.

Referring to FIG. 12, the light emitting device according to the embodiment includes a body 110 having a recess 111, a plurality of electrodes 121A and 125A disposed in the recess 111, a light emitting chip 131A disposed on the plurality of electrodes 121A and 125A, a first dampproof layer 171B covering a surface of the light emitting chip 131A and a light transmitting layer 161 disposed on the first dampproof layer 171B.

The light emitting chip 131A may emit an ultraviolet wavelength, that is, a wavelength in the range of 100 nm to 280 nm. The light emitting chip 131A is disposed on the plurality of electrodes 121A and 125A, for example, in a flip chip manner. Since the light emitting chip 131A is disposed in a flip chip manner, it is not necessary to dispose a separate connection member, so water or moisture through the connection member connected to the light emitting chip 131A may be prevented, and defect of the connection member may be prevented.

The light emitting device according to the embodiment may be disposed in the recess 111 in a flip chip manner and the first dampproof layer 171B may be disposed in the recess 111. The dampproof layer 171B may be extended from upper surfaces of the first and second electrodes 121A and 125A to an upper surface of the light emitting chip 131A in a stepped structure. Accordingly, the dampproof layer 171B may provide a uniform dampproof effect in the region of the recess 111. Further, a molding member may be further disposed on an outer side of the body 110 to perform dampproofing and device protection. A thickness of an upper surface of the dampproof layer 171B from the upper surface of the light emitting chip 131A may be, for example, in the range of 0.5 μm to 10 μm. When the thickness of the dampproof layer 171B exceeds the above mentioned range, light transmittance is remarkably decreased. When the thickness of the dampproof layer 171B is less than the above range, moisture resistance may be deteriorated. In the embodiment, the light emitting device is described as being disposed in the recess 111 in a flip chip manner, but the present invention is not limited thereto. The light emitting device may be disposed in the recess in a horizontal or vertical manner.

FIG. 13 is a side cross-sectional view of a light emitting device according to an eighth embodiment.

Referring to FIG. 13, the light emitting device according to the embodiment includes a body 110 having a recess 111, a plurality of electrodes 121A and 125A disposed in the recess 111, a light emitting chip 131A disposed on the plurality of electrodes 121A and 125A, a light transmitting layer 161 disposed on the recess 111, and a dampproof layer 171C disposed on a lower surface of the light transmitting layer 161.

The dampproof layer 171C may be disposed on the lower surface of the light transmitting layer 161, and the outer peripheries thereof may be adhered to an adhesive 163. Thus, the step of forming the dampproof layer 171C in a separate area is simplified, and the dampproof layer 171C is formed on the lower surface of the light transmitting layer 161, so that the dampproof layer 171C may be disposed in the coupling step of the light transmitting layer 161. Further, the outer side part of the dampproof layer 171C is vertically overlapped with a stepped structure 115, so that water or moisture penetration through the stepped structure 115 may be prevented.

The light emitting chip 131A may emit an ultraviolet wavelength, that is, a wavelength in the range of 100 nm to 280 nm. The light emitting chip 131A may be disposed on the electrodes 121A and 125A in a flip chip manner or may be connected to the connection member described above. However, the present invention is not limited thereto. A thickness of the dampproof layer 171C may be in the range of 0.5 μm to 10 μm, when the thickness of the dampproof layer 171C exceeds the above range, light transmittance is remarkably decreased, and when less than the above range, moisture resistance is reduced.

FIG. 14 is a side cross-sectional view of a light emitting device according to a ninth embodiment.

Referring to FIG. 14, the light emitting device according to the embodiment includes a body 110 having a recess 111, a plurality of electrodes 121A and 125A disposed in the recess 111, a light emitting chip 131A disposed on the plurality of electrodes 121A and 125A, and a dampproof layer 171A covering a surface of the light emitting chip 131A.

A side wall 116 of the recess 111 may be extended in a vertical direction from an upper surface of the body 110, thereby simplifying the manufacturing process. Further, by removing a light transmitting layer in the recess 111, light loss due to the light transmitting layer may be reduced.

The light emitting chip 131A may emit an ultraviolet wavelength, that is, a wavelength in the range of 100 nm to 280 nm. The light emitting chip 131A may be disposed on the electrodes 121A and 125A in a flip chip manner. An upper surface of the dampproof layer 171A may be formed in a flat surface or a stepped structure as shown in FIG. 12. A thickness of the dampproof layer 171A may be less than or equal to 1 mm, and the thickness may cover at least the light emitting chip 131A, and when it exceeds 1 mm, the transmittance of ultraviolet may be reduced. A thickness from an upper surface of the light emitting chip 131A may be formed, for example, in the range of 0.5 μm to 10 μm. When the thickness of the dampproof layer 171A exceeds the above mentioned range, light transmittance is remarkably decreased, and when the thickness is less than the above range, moisture resistance is deteriorated.

FIG. 15 is a side cross-sectional view of a light source module according to a tenth embodiment.

Referring to FIG. 15, the light source module according to the embodiment includes a body 110 having a recess 111, a plurality of electrodes 121, 123 and 125 disposed in the recess 111, a light emitting chip 131 disposed on at least one of the plurality of electrodes 121, 123 and 125, a light transmitting layer 161 disposed on the recess 111, a circuit board 201 disposed below the body 110, and a dampproof layer 175 disposed on an upper surface of the light transmitting layer 161, an upper surface and a side surface of the body 110, and an upper surface of the circuit board 201.

The light emitting chip 131 may emit an ultraviolet wavelength, that is, an ultraviolet wavelength in the range of 100 nm to 280 nm. The light emitting chip 131 may be arranged in a flip chip manner or by die bonding. The light transmitting layer 161 may be formed of a glass material having no damage, such as bonding failure between molecules due to the ultraviolet wavelength. The dampproof layer 175 has a fluororesin-based material, and may transmit light without being broken by the light emitted from the light emitting chip 131. The dampproof layer 175 may be extended from the upper surface of the light transmitting layer 161 to the upper surface of the body 110 and the upper surface of the circuit board 201. The dampproof layer 175 may block water or moisture penetrating through the side surface and the upper surface of the body 110, as well as water or moisture penetrating the circuit board 201. A thickness of the dampproof layer 175 may be in the range of 0.5 μm to 10 μm, and when the thickness of the dampproof layer 175 is more than the above range, light transmittance is remarkably decreased, and when less than the above range, moisture resistance is reduced.

A portion 175A of the dampproof layer 175 may be disposed in a region between a lower surface of the body 110 and the circuit board 201, and may block water or moisture penetration.

The circuit board 201 includes a plurality of bonding pads 204 and 205 and the plurality of bonding pads 204 and 205 may be electrically connected to first and second pads 141 and 145 disposed on the lower surface of the body 110.

The circuit board 201 may be connected to signal cables 211 and 213 through external connection terminals 207 and 208, and the signal cables 211 and 213 may supply power from the outside. The dampproof layer 175 covers the bonding portions of the external connection terminals 207 and 208 and the signal cables 211 and 213, and it may prevent water or moisture penetration.

The plurality of the signal cables 211 and 213 are spaced apart from each other and may be drawn out through the dampproof layer 175.

FIG. 16 is a side cross-sectional view of a light source module according to an eleventh embodiment.

Referring to FIG. 16, the light source module according to the embodiment includes a body 110 having a recess 111, a plurality of electrodes 121, 123 and 125 disposed in the recess 111, a light emitting chip 131 disposed on at least one of the plurality of electrodes 121, 123 and 125, a light transmitting layer 161 disposed on the recess 111, a circuit board 201 disposed below the body 110, a dampproof layer 177 extended from an upper surface of the light transmitting layer 161 to an upper surface of the body 110, and a molding member 181 covering the body 110 and a surface of the circuit board 201.

The light emitting chip 131 may emit an ultraviolet wavelength, that is, a wavelength in the range of 100 nm to 280 nm. The light transmitting layer 161 may be formed of a glass material having no damage due to the ultraviolet wavelength. The dampproof layer 177 may be extended from the upper surface of the light transmitting layer 161 to the upper surface of the body 110 to block water or moisture penetrating into the body 110. The dampproof layer 177 has a fluororesin-based material, and may transmit light without causing bonding destruction between molecules by the light emitted from the light emitting chip 131.

The dampproof layer 177 may be provided in the form of a film, and an adhesive layer 164 is bonded between the dampproof layer 177 and the upper surface of the body 110. The adhesive layer 164 may be an adhesive for ultraviolet. An outer frame portion 177A of the dampproof layer 177 may protrude further outward than a side surface of the body 110, so that coupling force with the molding member 181 may be increased. Water or moisture may be double-blocked by the molding member 181 and the dampproof layer 177.

Since the dampproof layer 177 is provided in a film form, it is bonded to the upper surfaces of the body 110 and the light transmitting layer 161 and may be provided with a thickness of 1 mm or less, for example, a thickness ranging from 0.025 mm to 1 mm. Since a coating layer according to dipping is not formed on the dampproof layer 177 in a film form, the transmittance may be maintained at 70% or more even if it is provided thicker than the dipping process. In the case in which the dampproof layer 177 is thicker than 1 mm, light extraction efficiency may be lowered, and in the case in which the thickness is less than 0.025 mm, transmittance is improved, but a work process becomes difficult due to warping or wrinkling.

The circuit board 201 is disposed below the body 110 and is electrically connected to the light emitting chip 131 in the body 110. The circuit board 201 may include a connector 210 and the connector 210 is connected to signal cables 211 and 213 supplying power.

The molding member 181 is molded on the side surface of the body 110 and the surface of the circuit board 201.

The molding member 181 has an open region 182 and the open region 182 exposes the dampproof layer 177. An upper portion 181A of the molding member 181 may be adhered to the outer frame portion 177A of the dampproof layer 177 and a lower portion 181B may cover a lower surface of the circuit board 201. A width D3 of the open region 182 may be equal to or wider than a width of the light transmitting layer 161. By providing the open region 182, light loss due to the contact interface between the molding member 181 and the dampproof layer 177 may be reduced.

The molding member 181 may be formed of a resin material such as silicone, epoxy, or urethane. An upper surface of the molding member 181 may be disposed at a higher position than the upper surface of the body 110 and may be in close contact with an upper surface of the dampproof layer 177. Accordingly, the dampproof layer 177 may prevent water or moisture from penetrating into the body 110.

The molding member 181 molds the connector 210 and the signal cables 211 and 213 to expose a part of the signal cables 211 and 213. Accordingly, by dampproofing with the dampproof layer 177 and by molding the surfaces of the circuit board 201, the connector 210 and the signal cables 211 and 213 with the molding member 181, it is possible to prevent water or moisture from penetrating through the interface between the circuit board 201 and the body 110. As another example, a dampproof layer may be disposed in the recess 111 of the body 110, but the present invention is not limited thereto.

FIG. 17 is a side cross-sectional view of a light source module according to a twelfth embodiment.

Referring to FIG. 17, the light source module according to the embodiment includes a body 110 having a recess 111, a plurality of electrodes 121, 123 and 125 disposed in the recess 111, a light emitting chip 131 disposed on at least one of the plurality of electrodes 121, 123 and 125, a light transmitting layer 161 disposed on the recess 111, a circuit board 201 disposed below the body 110, a dampproof layer 178 extended from an upper surface of the light transmitting layer 161 to an upper surface and a side surface of the body 110 and an upper surface of the circuit board 201 and a molding member 183 extended from a lower surface of the circuit board 201 to an outer side surface of the dampproof layer 178.

The light emitting chip 131 may emit an ultraviolet wavelength, that is, a wavelength in the range of 100 nm to 280 nm. The light transmitting layer 161 may be formed of a glass material having no damage due to the ultraviolet wavelength. The dampproof layer 178 has a fluororesin-based material and may transmit light without being broken by the light emitted from the light emitting chip 131. The dampproof layer 178 is extended from the upper surface of the light transmitting layer 161 to the upper surface and the side surface of the body 110. The dampproof layer 178 is extended to the upper surface of the circuit board 201. A portion of the dampproof layer 178 is disposed between a lower surface of the body 110 and the circuit board 201 to block water or moisture penetrating the lower surface of the body 110. A thickness of the dampproof layer 178 may be in the range of 0.5 μm to 10 μm, and when the thickness of the dampproof layer 178 exceeds the above range, light transmittance is remarkably decreased, and when less than the above range, moisture resistance is reduced.

A part of signal cables 211 and 213 connected to the circuit board 201 is coated with the dampproof layer 178.

The molding member 183 is molded on the outer side part of the dampproof layer 178 and the surface of the circuit board 201. The molding member 183 is molded on the outer side part of the dampproof layer 178 disposed on the side surface of the body 110 to double-protect the side surface of the body 110.

The molding member 183 has an open region, and the open region exposes an upper surface of the dampproof layer 178. The molding member 183 may be formed of a resin material such as silicone, epoxy, or urethane. An upper surface of the molding member 183 may be disposed higher than the upper surface of the body 110 and may be the same horizontal surface with the upper surface of the dampproof layer 178. Thus, the surface shape of the light emitting device is flattened, and water or moisture may be prevented from being collected in a non-flat region.

The molding member 183 molds a part of the signal cables 211 and 213 and exposes a part of the signal cables 211 and 213. Accordingly, by dampproofing with the dampproof layer 178 and by molding the surfaces of the outer side part of the dampproof layer 178, the circuit board 201, and the signal cables 211 and 213 with the molding member 183, it is possible to prevent water or moisture from penetrating through the interface between the circuit board 201 and the body 110. As another example, a dampproof layer may be disposed in the recess 111 of the body 110, but the present invention is not limited thereto.

FIG. 18 is a side cross-sectional view of a light source module according to a thirteenth embodiment.

Referring to FIG. 18, the light source module according to the embodiment includes a body 110 having a recess 111, a plurality of electrodes 121, 123 and 125 disposed in the recess 111, a light emitting chip 131 disposed on at least one of the plurality of electrodes 121, 123 and 125, a light transmitting layer 161 disposed on the recess 111, a circuit board 201 disposed below the body 110, a dampproof layer 178 extended from an upper surface of the light transmitting layer 161 to an upper surface and a side surface of the body 110 and an upper surface of the circuit board 201, a molding member 183 extended from a lower surface of the circuit board 201 to an outer side part of the dampproof layer 178, and a case 221 on a surface of the molding member 183. Among these configurations, the same parts as those of FIG. 17 will be described with reference to FIG. 17.

The case 221 covers a side surface and a lower surface of the molding member 183. That is, the light source module of FIG. 17 is inserted into a housing part of the case 221. The case 221 may be coupled with a cover 223 having an open region. The open region of the cover 223 may be opened in a region corresponding to the recess 111. The cover 223 covers the upper surface of the molding member 183. The case 221 and the cover 223 may be formed of a plastic material, but are not limited thereto.

The cover 223 may be bonded or fastened to the case 221. The case 221 and the cover 223 protect the entire module from an external impact. In addition, the case 221 may prevent water or moisture from penetrating through a lower portion.

The light emitting device and the light source module including the same according to the embodiment may be used as a device for sterilizing an indoor unit, an evaporator and condensed water of a refrigerator, and a sterilizing device in an appliance such as a air washer, and a sterilizing device for a water reservoir and discharge water of a water purifier, and a sterilizing device in a toilet. Such a sterilizing device may optionally include the above-described dampproof layer.

The features, structures, effects and the like described in the embodiments are included in at least one embodiment of the present invention and are not necessarily limited to only one embodiment. Furthermore, the features, structures, effects and the like illustrated in the embodiments may be combined or modified by other persons skilled in the art to which the embodiments belong. Accordingly, it is to be understood that such combination and modification are included in the scope of the present invention.

INDUSTRIAL APPLICABILITY

The light emitting device of the embodiment may improve the reliability of dampproofing.

The light emitting device of the embodiment may be applied to a sterilizing apparatus.

The invention claimed is:

1. A light emitting device comprising:
   a body having a recess;
   a light emitting chip disposed in the recess;
   a first dampproof layer sealing the light emitting chip and extended from a surface of the light emitting chip to a bottom of the recess; and
   a light transmitting layer disposed on the recess and spaced apart from the first dampproof layer; and a second dampproof layer extended from an upper surface of the body to an upper surface of the light transmitting layer,
wherein light emitted from the light emitting chip includes a wavelength range of 100 nm to 280 nm,
wherein the body includes a ceramic material,
wherein the first dampproof layer includes a light transmitting material,
wherein the light transmitting layer includes a glass material,
wherein the recess includes an empty space disposed between the first dampproof layer and the light transmitting layer, and
wherein the second dampproof layer includes a fluororesin-based material.

2. The light emitting device of claim 1, wherein the first dampproof layer has a thickness within a range from 0.5 μm to 10 μm on a top surface of the light emitting chip,
the first dampproof layer includes a fluororesin-based material, and
wherein the first dampproof layer has a transmittance of 70% or more with respect to a wavelength emitted from the light emitting chip.

3. The light emitting device of claim 1, wherein the first dampproof layer is attached to a side surfaces and a top surface of the light emitting chip,
wherein a thickness of the first dampproof layer is equal to or less than 1 mm,
the first dampproof layer includes a fluororesin-based material, and
wherein the first dampproof layer has a transmittance of 70% or more with respect to a wavelength emitted from the light emitting chip.

4. The light emitting device of claim 1, comprising a plurality of electrodes are included in the recess and a plurality of pads electrically connected to the plurality of electrodes on a lower surface of the body,
wherein the light emitting chip is disposed on at least one of the plurality of electrodes and the light emitting chip is electrically connected to the plurality of electrodes, and
wherein an upper surface of the first dampproof layer is disposed higher than a top surface of the light emitting chip and extended to a side wall of the recess.

5. The light emitting device of claim 1, wherein the second dampproof layer extends to a side surface of the body.

6. The light emitting device of claim 1, further comprising a molding member disposed on a side surface of the body.

7. The light emitting device of claim 1, wherein the first dampproof layer includes at least one of PCTFE (Polychlorotrifluoroethylene), ETFE (Ethylene+Tetrafluoroethylene), FEP (Fluorinated ethylene propylene copolymer), and PFA (Perfluoroalkoxy).

8. A light source module comprising:
the light emitting device of claim 1; and
a circuit board disposed below the body of the light emitting device.

9. The light emitting device of claim 1, wherein the first dampproof layer has a fluorine content within a range of 1 wt % to 3 wt %, and
wherein the first dampproof layer has a thickness within a range from 0.5 μm to 10 μm.

10. The light emitting device of claim 1, wherein the first dampproof layer includes a first portion on a top surface of the light emitting chip and a second portion around the light emitting chip, and
wherein a thickness of the first portion is greater than a thickness of the second portion.

11. The light emitting device of claim 1, wherein the first dampproof layer directly contacts the surface of the light emitting chip, and
wherein an area of the upper surface of the light transmitting layer is greater than an area of an upper surface of the first dampproof layer.

12. The light emitting device of claim 1, wherein a lower surface of the light transmitting layer is disposed at a higher position than an entire upper surface of the first dampproof layer.

13. The light emitting device of claim 1, wherein a thickness of the second dampproof layer is less than a thickness of the light transmitting layer.

14. The light emitting device of claim 13, wherein the second dampproof layer directly contacts the upper surface of the body and the upper surface of the light transmitting layer.

15. A light emitting device comprising:
a body having a recess;
a light emitting chip disposed in the recess;
a first dampproof layer sealing the light emitting chip and extended from a surface of the light emitting chip to a bottom of the recess;
a light transmitting layer disposed on the recess and spaced apart from the first dampproof layer; and
a second dampproof layer having an open area in which an upper surface of the light transmitting layer is exposed and extended from an outer side area of the upper surface of the light transmitting layer to an upper surface and a side surface of the body,
wherein light emitted from the light emitting chip includes a wavelength range of 100 nm to 280 nm,
wherein the body includes a ceramic material,
wherein the first dampproof layer includes a light transmitting material,
wherein the light transmitting layer includes a glass material,
wherein the recess includes an empty space disposed between the first dampproof layer and the light transmitting layer,
wherein the second dampproof layer includes a fluororesin-based material.

16. The light emitting device of claim 15, wherein a width of the open area of the second dampproof layer is smaller than a width of the upper surface of the light transmitting layer.

17. The light emitting device of claim 16, wherein an outer portion of the light transmitting layer is disposed on a stepped structure of the body, and
wherein the outer portion of the light transmitting layer vertically overlaps the second dampproof layer and directly contacts the second dampproof layer.

18. The light emitting device of claim 16, wherein the second dampproof layer on the side surface of the body contacts a lower end of the side surface of the body.

* * * * *